United States Patent
Waldfried et al.

(10) Patent No.: US 12,031,212 B2
(45) Date of Patent: Jul. 9, 2024

(54) YTTRIUM FLUORIDE FILMS AND METHODS OF PREPARING AND USING YTTRIUM FLUORIDE FILMS

(71) Applicant: ENTEGRIS, INC., Billerica, MA (US)

(72) Inventors: Carlo Waldfried, Middleton, MA (US); Stephen Longo, Westford, MA (US); Parul Tyagi, Littleton, MA (US)

(73) Assignee: ENTEGRIS, INC., Billerica, MA (US)

(*) Notice: Subject to any disclaimer, the term of this patent is extended or adjusted under 35 U.S.C. 154(b) by 164 days.

(21) Appl. No.: 17/230,742

(22) Filed: Apr. 14, 2021

(65) Prior Publication Data

US 2021/0317572 A1   Oct. 14, 2021

Related U.S. Application Data (60) Provisional application No. 63/009,884, filed on Apr. 14, 2020.

(51) Int. Cl.
| | |
|---|---|
| C23C 16/56 | (2006.01) |
| C23C 16/02 | (2006.01) |
| C23C 16/40 | (2006.01) |
| C23C 16/44 | (2006.01) |
| C23C 16/455 | (2006.01) |
| H01L 21/02 | (2006.01) |

(52) U.S. Cl.
CPC .......... *C23C 16/56* (2013.01); *C23C 16/0272* (2013.01); *C23C 16/405* (2013.01); *C23C 16/4404* (2013.01); *C23C 16/45525* (2013.01); *H01L 21/02* (2013.01); *Y10T 428/265* (2015.01); *Y10T 428/31678* (2015.04)

(58) Field of Classification Search
CPC . C23C 16/405; C23C 16/56; C23C 16/45525; C23C 16/0272
See application file for complete search history.

(56) References Cited

U.S. PATENT DOCUMENTS

| | | | |
|---|---|---|---|
| 2016/0273095 A1* | 9/2016 | Lin | .................. H01J 37/32495 |
| 2017/0314125 A1 | 11/2017 | Fenwick | |
| 2018/0105932 A1* | 4/2018 | Fenwick | ............... C23C 28/042 |
| 2018/0202047 A1 | 7/2018 | Lin | |
| 2018/0327892 A1 | 11/2018 | Wu | |
| 2018/0327899 A1* | 11/2018 | Wu | .................. H01J 37/32908 |
| 2019/0078206 A1* | 3/2019 | Wu | .................. C23C 16/45565 |
| 2019/0185999 A1 | 6/2019 | Shanbhag et al. | |

FOREIGN PATENT DOCUMENTS

| | | | |
|---|---|---|---|
| JP | 2007217782 A | * | 8/2007 |
| WO | 2016148739 A1 | | 9/2016 |

OTHER PUBLICATIONS

Machine translation of JP2007-217782A (published Aug. 2007), Powered by EPO and Google. (Year: 2007).*

(Continued)

*Primary Examiner* — Monique R Jackson (57) ABSTRACT

Described are yttrium fluoride compositions, including deposited films, e.g., coatings, that contain yttrium fluoride; methods of preparing yttrium fluoride compositions and deposited film coatings that contain yttrium fluoride; as well as substrates that have a deposited film coating that contains yttrium fluoride at a surface and methods and equipment that include the substrates.

6 Claims, 4 Drawing Sheets

(56) References Cited

OTHER PUBLICATIONS

Alshaltami, Investigation of etching optimization in capacitively coupled SF6-O2 plasma, 2019, AIP Advances 9, 035047. (Year: 2019).*

Liu, An overview of diagnostic methods of low pressure capacitively coupled plasmas, 2012, Thin Solid Films 521, pp. 141-145. (Year: 2012).*

Bi, A brief review of dual frequency capacitively coupled discharges, 2011, Current Applied Physics 11, pp. S2-S8. (Year: 2011).*

Lei et al., Preparation and optical properties of sputtered-deposition yttrium fluoride film., Nuclear Instruments and Methods in Physics Research B., vol. 307., pp. 429-433., 2013.

* cited by examiner

FIG. 4

YTTRIUM FLUORIDE FILMS AND METHODS OF PREPARING AND USING YTTRIUM FLUORIDE FILMS

FIELD

The present description relates to yttrium fluoride films, including protective coatings; methods of preparing yttrium fluoride films; substrates and surfaces that include an yttrium fluoride film; and methods of preparing and using yttrium fluoride films.

BACKGROUND

Semiconductor and microelectronic device manufacturing methods require various processing steps that involve highly reactive process materials such as plasmas. Example processes that use reactive process materials include plasma etching steps, plasma deposition steps, and plasma cleaning steps. These processes are performed at an interior of a process chamber that contains a workpiece (e.g., "substrate") and the reactive process materials. The process chamber also includes various structures and components (a.k.a. "process chamber components") that define the process chamber and items internal to the process chamber or associated with the chamber, that are required for operation. These process chamber components may include chamber walls, flow conduits (e.g., flow lines, flow heads, piping, tubing, and the like), fasteners, trays, supports, and other structures and devices that are used to support a workpiece or to deliver or contain reactive process materials relative to the process chamber.

For use as part of a process chamber, a process component should be resistant to the reactive process materials that will be used within the process chamber. The process chamber components should not become degraded or damaged by contact with the process materials, especially in a manner that would produce debris or particulates that may become incorporated into the process that is being performed and potentially contaminate a workpiece being processed.

Process chamber components used in semiconductor processing equipment for manufacturing semiconductor and microelectronic devices are frequently made of a solid material (a "substrate" or a "base") such as a metal (e.g., stainless steel, aluminum alloy which may optionally be anodized, tungsten), a mineral, or ceramic material, etc. The substrate is usually coated with a protective layer that is more resistant to reactive process materials than is the substrate material. In the past, such protective thin film coatings have typically been placed onto a substrate by various useful methods, typically by processes of anodizing (e.g., to produce anodized aluminum), spray coating, or a deposition method (e.g., physical vapor deposition (PVD), chemical vapor deposition (CVD), or atomic layer deposition (ALD)).

SUMMARY

As described herein, yttrium fluoride ("$YF_3$") may be prepared as part of a deposited film by converting yttrium oxide of a deposited yttrium oxide film, to yttrium fluoride. The resultant yttrium fluoride film can have a relatively high concentration of fluorine and a relatively low concentration of oxygen. Due to the relatively high fluorine content (e.g., compared to fluorinated metal oxides such as YOF), the yttrium fluoride film can be effective as a material of a protective coating.

Previous and current methods that may be useful to prepare a deposited film as a protective coating material, and that contain a relatively high amount of fluorine (higher for example than that of YOF), have been difficult to use due to complications of working with fluorine chemistries, such as Environmental Health and Safety regulations, compatibility of processing equipment with highly fluorinated raw materials, abatement and disposal procedures, among others.

Yttrium fluoride has previously been used for purposes other than as a protective coating material. As one example, yttrium fluoride has been formed into transparent, low index of refraction films used as optical coatings. Previous yttrium fluoride films have been formed by sputtering techniques that do not allow for even and continuous deposition of yttrium fluoride over three-dimensional surfaces, especially three-dimensional surfaces that have a feature that has a high aspect ratio.

Yttrium fluoride materials as described differ from previous deposited yttrium fluoride films, such as those formed by sputter-deposition techniques. Yttrium fluoride films of the present description, for example, may be formed as continuous films over three-dimensional surfaces, including surfaces that have high aspect ratio structures. Because yttrium fluoride films of the present description are formed by converting yttrium oxide to yttrium fluoride, by a fluoro-annealing the yttrium oxide, yttrium fluoride films of the present description may also contain an amount of oxygen, particularly at lower portions of the film thickness, and may contain a varied concentration of fluorine, oxygen, or both, along the thickness (depth) of the thin film.

Methods of the present description are particularly useful for forming yttrium fluoride by converting yttrium oxide to yttrium fluoride from a deposited yttrium oxide film that has been formed by atomic layer deposition. Analogous methods have not been shown to be effective with other (non-yttrium) metal oxide materials, or with yttrium oxide or other metal oxide deposited films that are formed by a deposition method other than atomic layer deposition.

As used herein, a "deposited thin film," "thin film," or "film," etc., refers to a coating of material that has been deposited onto a surface of a substrate by a deposition method, such as by an atomic layer deposition method, and also refers to modified forms or derivatives of those deposited films, including films that are initially deposited and then subsequently chemically modified by a fluorination step.

In one aspect, a coated substrate is described herein. The coated substrate includes: a substrate; and an yttrium fluoride film formed on the substrate. The yttrium fluoride film comprises: yttrium, fluorine, oxygen, a surface, a thickness, and an yttrium fluoride portion that extends from the surface over a portion of the thickness that has a concentration of oxygen below 20 percent (atomic). A concentration of the fluorine in the yttrium fluoride film varies relative to the thickness.

In another aspect, a method of preparing yttrium fluoride is described herein. The method includes: depositing an yttrium oxide film onto a surface by atomic layer deposition, and exposing the yttrium oxide film to fluorine and elevated temperature to convert yttrium oxide of the yttrium oxide film to yttrium fluoride.

DETAILED DESCRIPTION

The following description relates to deposited thin films that contain yttrium fluoride (sometimes referred to as "yttrium fluoride thin films," or alternately "yttrium fluoride films"), to protective coatings that include an yttrium fluoride thin film, and to substrates that have a surface and an yttrium fluoride thin film deposited thereon. The substrate surface may be a highly three-dimensional surface, for instance a surface that has at least one structure that exhibits a high aspect ratio.

The description also relates to methods for preparing and methods of using yttrium fluoride thin films, including yttrium fluoride thin films that function as a protective coating.

According to methods as presently described, a deposited thin film that contains yttrium fluoride can be formed from a deposited yttrium oxide thin film by converting at least a portion of the yttrium oxide of the deposited yttrium oxide thin film to yttrium fluoride. For example, a method may include a step of depositing yttrium oxide as a thin film onto a surface by an atomic layer deposition (ALD) technique. Subsequently, at least a portion of the yttrium oxide of the deposited film is converted to yttrium fluoride by a fluoro-annealing step. The fluoro-annealing step is performed at a relatively high temperature and for an amount of time that result in a high amount of the yttrium oxide being converted to yttrium fluoride ($YF_3$) instead of remaining in the form of fluorinated yttrium oxide (YOF).

Yttrium fluoride is an inorganic material that is made of yttrium and fluorine, with the chemical makeup of $YF_3$, or approximately so. In the present description, an yttrium fluoride thin film, or a portion thereof, contains mostly yttrium and fluorine atoms, with a high amount of the yttrium and fluorine being in the form of yttrium fluoride or $YF_3$. An yttrium fluoride thin film can also contain an amount of oxygen and various elemental combinations of yttrium, fluorine, and oxygen, such as fluorinated yttrium oxide (YOF). However, a preferred yttrium fluoride thin film, or a portion thereof, can contain an amount (concentration) of oxygen that is below an amount of oxygen that would be present in a composition that would be referred to as fluorinated yttrium oxide (YOF), e.g., not more than 20 percent oxygen measured at a specific location along the thickness (depth) of the yttrium fluoride thin film.

The yttrium fluoride thin film overall, over its entire thickness, contains substantially only yttrium, fluorine, oxygen, an optional but relatively low amount of carbon ("C") (e.g., up to 4 or 5 atomic percent carbon), and not more than a minor or unsubstantial amount of other materials. An yttrium fluoride thin film as described may consist of Y, F, O, and C (e.g., up to 4 or 5 atomic percent carbon), or may consist essentially of Y, F, O, and C, e.g., may contain Y, F, O, and C (e.g., not more than 5 or 4 percent (atomic) carbon) and not more than 1, 0.5, 0.1, 0.05, or 0.01 atomic percent of any material different from Y, F, O, and C.

Methods of forming yttrium fluoride thin films as described have been identified as particularly effective for producing thin films that contain a high concentration of yttrium fluoride, particularly for forming the thin films onto three-dimensional and high aspect ratio surfaces. Methods as described do not deposit yttrium fluoride ($YF_3$) itself directly onto a surface. Methods as described instead form yttrium fluoride by: forming an yttrium oxide thin film on a substrate by atomic layer deposition, and converting at least a portion of the yttrium oxide of that deposited thin film to yttrium fluoride by a fluoro-annealing step.

These steps have been shown to be especially effective for forming a thin film that contains a high concentration of yttrium fluoride, as compared to alternative methods that initially deposit an yttrium oxide thin film by a different method of deposition (e.g., chemical vapor deposition, physical vapor deposition, or variations of these) followed by a fluoro-annealing step. Yttrium fluoride thin films as described may be prepared by converting a deposited yttrium oxide thin film to yttrium fluoride by use of a relatively high temperature fluoro-annealing step, e.g., a fluoro-annealing step that is performed at a temperature of at least 300 degrees Celsius. Comparable fluoro-annealing techniques, at a relatively high temperature, attempting to convert yttrium oxide to yttrium fluoride, were not as effective when performed on yttrium oxide that had been deposited by a different deposition technique, such as physical vapor deposition ("PVD") or chemical vapor deposition ("CVD").

These particular steps have also been determined to be more effective for forming a highly fluorinated metal fluoride material, i.e., $YF_3$, compared to methods of forming other types of metal fluorides, from other metals, by comparable deposition and fluoro-annealing steps. A high temperature fluoro-annealing step as described was less effective for converting other metal oxides to metal fluorides, even for a metal oxide that had been deposited by an atomic layer deposition technique. Specifically, a fluoro-annealing step, at a relatively high temperature, was found to be less effective for converting metal oxide materials such as zirconium oxide, titanium oxide, or aluminum oxide, to a fluorinated oxide material (zirconium fluoride, titanium fluoride, or aluminum fluoride), even if the metal oxide had been deposited by an atomic layer deposition technique.

In preferred methods, due to the thermal stresses experienced by the deposited yttrium oxide thin film during the relatively high temperature fluoro-annealing step, an intermediate layer (e.g., a "buffer layer") may be placed on the substrate surface between the substrate surface and the deposited yttrium oxide thin film. The intermediate layer (described in more detail below) can be effective to allow the deposited yttrium oxide thin film to be processed by the fluoro-annealing step, at a relatively high fluoro-annealing temperature, without causing the deposited yttrium oxide thin film to crack or to be otherwise physically damaged by the stresses produced during the high temperature fluoro-annealing step.

Advantageously, methods of this description allow for preparing an yttrium fluoride thin film by exclusively gas-phase techniques, i.e., atomic layer deposition and fluoro-annealing techniques. Previous methods of forming yttrium fluoride films have relied on sputtering techniques, which are considered to be "line-of-sight" techniques that are not effective to evenly deposit yttrium fluoride on three-dimensional surfaces or surfaces that include a high aspect ratio structure. According to presently-described methods, deposited thin films that contain yttrium fluoride can be efficiently and effectively formed on three-dimensional surfaces, including surfaces that have high aspect ratio structures.

Example deposited thin films of the present description can be distinguished from previous sputter-formed yttrium fluoride thin films in one respect by being evenly deposited over a surface that is substantially three-dimensional or has a high aspect ratio structure. Alternately, or in addition, a deposited thin film of the present description may be distinguished from sputter-formed yttrium fluoride thin films by containing oxygen at portions of the thin film, particularly at portions at a depth below a surface of the thin film. Sputter-formed yttrium fluoride thin films will be formed from only yttrium and fluorine, and will not contain more than an insubstantial amount of oxygen.

In a related sense, an yttrium fluoride thin film of the present description will contain amounts, i.e., concentrations, of fluorine and oxygen that will be non-uniform in a thickness (depth) direction, i.e., will contain concentrations of fluorine and oxygen that will vary in a measurable amount along a thickness (depth) of the deposited film. An yttrium fluoride film formed by sputtering will not exhibit a substantially varied concentration of fluorine, or of oxygen, along a thickness of the deposited film.

A film as described can be produced by methods that include a step of forming on a substrate surface, by atomic layer deposition, a deposited yttrium oxide thin film. The substrate surface may optionally include an intermediate layer as described elsewhere herein, before the yttrium oxide thin film is deposited. Yttrium oxide ($Y_2O_3$, a.k.a., "yttria") is prepared from and contains yttrium and oxygen in relative amounts (atomic) of approximately 2:3 (yttrium:oxygen). Methods of forming yttrium oxide by atomic layer deposition are known. See, e.g., United States Patent Publication 2018/0202047.

In example methods, a deposited yttrium oxide thin film can be formed on a substrate by an atomic layer deposition method that deposits yttrium oxide onto a substrate surface that is held at a temperature of in a range from 100° Celsius to 350° Celsius, e.g., in a range from 140° C. to 200° C. The yttrium oxide deposited thin film can be formed to any useful thickness, such as a thickness in a range from about 0.01 microns (10 nm), up to or greater than 0.25 microns (250 nm), 0.5 microns (500 nm), 0.75 micron (750 nm), or 1 micron. After depositing the yttrium oxide thin film, the deposited yttrium oxide thin film is processed by a fluorine annealing step ("fluoro-annealing" step) that converts at least a portion of the total amount of yttrium oxide of the deposited thin film, to yttrium fluoride. The fluoro-annealing step is performed at a temperature and for a time that is effective to not merely fluorinate the yttrium oxide to form yttrium oxyfluoride (or "fluorinated yttrium oxide," YOF). The temperature and amount of time of the fluoro-annealing step are sufficient to convert at least a substantial portion of the yttrium oxide of the deposited yttrium oxide thin film to yttrium fluoride ($YF_3$), especially at a surface portion of the deposited yttrium oxide thin film. According to useful or preferred methods, at least an outer surface or "surface portion" of the yttrium oxide thin film, including a portion of the thickness of the thin film between the surface and a depth of at least 1, 5, 10, 15, 20, 25, 30, 35, 40, 45, or 50 nanometers, is converted to $YF_3$ with a low amount of oxygen or with substantially no oxygen, e.g., with less than 15 atomic percent oxygen, less than 10, less than 5, or less than 3 atomic percent oxygen as measured by x-ray photoelectron spectroscopy over the entire thickness of the surface portion and with a high amount of fluorine, e.g., with at least 45 atomic percent oxygen, at least 50, at least 55, or at least 60 atomic percent fluorine as measured by x-ray photoelectron spectroscopy over the entire thickness of the surface portion. In some embodiments, the surface portion may have a thickness of at least 10 nanometers, less than 5 percent (atomic) oxygen as measured by x-ray photoelectron spectroscopy over the entire thickness of the surface portion, and at least 60 percent (atomic) fluorine as measured by x-ray photoelectron spectroscopy over the entire thickness of the surface portion. In some embodiments, the surface portion may have a thickness of at least 50 nanometers, less than 15 percent (atomic) oxygen as measured by x-ray photoelectron spectroscopy over the entire thickness of the surface portion, and at least 50 percent (atomic) fluorine as measured by x-ray photoelectron spectroscopy over the entire thickness of the surface portion.

Methods have previously been described for converting yttrium oxide to yttrium oxyfluoride (YOF) by a fluoro-annealing step performed at a temperature below 300 degrees Celsius. See United States Patent Publication 2018/0202047. The presently-described methods now include specific features of fluoro-annealing steps performed at temperatures that exceed 300 degrees Celsius, in a manner that successfully converts yttrium oxide, at least at a surface portion of a deposited yttrium oxide thin film, to contain a highly concentrated amount of yttrium fluoride ($YF_3$) with a low amount of oxygen, substantially no oxygen, or with a low amount of fluorinated yttrium oxide (YOF) or substantially no fluorinated yttrium oxide (YOF).

Useful and preferred fluoro-annealing techniques include steps of exposing an yttrium oxide surface, e.g., a surface of an yttrium oxide thin film deposited by atomic layer deposition, to molecular fluorine source vapor at a temperature that causes fluorine of the molecular fluorine source vapor to react with yttrium oxide of the deposited yttrium oxide thin film (a.k.a., "yttrium oxide layer") to form yttrium fluoride at and below a surface of the deposited yttrium oxide thin film.

As used herein, a "molecular fluorine source vapor" is a non-plasma (i.e., molecular) fluorine-containing chemical molecule that is in vapor (gaseous) form, that is not considered a plasma. A "plasma" is a non-solid, vapor phase composition that contains a high density of ionic fragments derived from one or more plasma precursor compounds that have been deliberately exposed to energy (e.g., from a radio frequency power source) for the purpose of breaking down the plasma precursor compound into the ions, to use the ions for processing a workpiece. In contrast to a plasma, a useful or preferred molecular fluorine source vapor may contain less than 1×10E-5 atomic percent ionized materials, such as less than 1×10E-6 atomic percent ionic species.

A molecular fluorine source vapor may be provided to a process chamber for forming an yttrium fluoride thin film by any method or from any useful and effective source or location. In useful or preferred methods, molecular fluorine source vapor may be produced in situ, meaning during a process of forming an yttrium fluoride thin film on a surface of a substrate, and within the process chamber used for forming the yttrium fluoride thin film on the surface. The molecular fluorine source vapor may be generated in situ from a non-gaseous fluorine source by heating the non-gaseous fluorine source to cause molecules of the non-gaseous fluorine source to become gaseous, i.e., a molecular vapor. The non-gaseous fluorine source may be a liquid or a solid fluorine-containing substance, and the heating step produces the gaseous form of the molecules without causing significant degradation or ionization of the molecules of the liquid or solid fluorine source. A useful or preferred gaseous form of the molecules may be at least 99.9999 atomic percent molecular, i.e., non-chemically-changed molecules of the liquid or solid fluorine-containing substance. The gaseous form of the molecules may contain less than 1×10E-5 atomic percent ionized or degraded materials, such as less than 1×10E-6 atomic percent ionic species.

The heating step that produces a molecular fluorine source vapor is distinct from a step of generating plasma, which is used in various semiconductor processing steps. In general, plasma-generating steps involve applying one or more forms of energy to a plasma source, which is generally a gaseous chemical substance, to ionize the plasma source and chemically degrade molecules of the plasma source to produce ionic fragments of the molecules. The energy may be heat energy (elevated temperature), electromagnetic radiation such as RF (radiation) (produced by a radio frequency power source), or combinations of these.

As a specific comparison, a heating step of the present description used to produce a molecular fluorine source vapor is different from a step of generating fluorine-containing plasma for use in a semiconductor processing tool for a step of plasma etching, plasma cleaning, or "seasoning" a process chamber of a semiconductor processing tool. An example of a plasma-generating step that is different from the presently-described heating step is described in U.S. Pat. No. 5,756,222, which describes a fluorine-containing plasma generated in a reaction chamber designed for a plasma etch or plasma cleaning process. The plasma is prepared by exposing a fluorine precursor to RF power.

A fluoro-annealing step can be performed in a process chamber, at elevated temperature, by: locating a substrate at an interior of the process chamber in a removable, temporary, non-operational manner, the substrate having a surface that includes a deposited yttrium oxide thin film deposited thereon by atomic layer deposition; dispensing molecular fluorine source vapor into the process chamber or generating molecular fluorine source vapor within the process chamber by heating non-gaseous fluorine source to cause molecules of the non-gaseous fluorine source to become gaseous, i.e., a vapor, within the process chamber; and elevating the temperature of the process chamber, the substrate, the deposited yttrium oxide thin film, the molecular fluorine source vapor, or a combination thereof to cause a reaction between fluorine of the molecular fluorine source vapor and yttrium oxide of the deposited yttrium oxide thin film to convert at least a portion of the yttrium oxide to yttrium fluoride.

During the fluoro-annealing step, the process chamber may contain processing materials that include the molecular fluorine source vapor, optionally a non-vapor fluorine source, and one or more substrates that have a deposited yttrium oxide thin film deposited at a surface by an atomic layer deposition technique. The interior space and atmosphere of the chamber need not be evacuated or at a reduced pressure, and may contain an amount of atmospheric air. There is no need to eliminate air or oxygen or to introduce an inert gas (purge gas, e.g., $N_2$) into the process chamber for the fluoro-annealing step. The process chamber need not contain and may exclude any other additional gaseous or liquid processing materials besides air and the molecular fluorine source vapor, e.g., may exclude other gaseous materials such as an inert gas or a gaseous co-reactant, which may sometimes be used in a gaseous atmosphere of other semiconductor processing steps.

The process chamber is not part of a semiconductor processing tool and need not contain and preferably does not contain any other workpiece such as a semiconductor device, microelectronic device, or a precursor thereof, that is being otherwise processed. The process chamber also does not require and does not involve the use of a means for generating plasma, such as a radio frequency power source or means for applying an electrical potential (voltage) to a component or workpiece.

A useful process chamber can preferably include: temperature control to control temperature within the chamber; means to control the composition and purity of the environment interior to the chamber, such as pressure controls, filters, etc.; components to temporarily contain and support one or multiple substrates, each having a deposited yttrium oxide thin film at a surface, within the chamber for a period useful to convert yttrium oxide of the deposited yttrium oxide thin film into yttrium fluoride; and components to control the composition of an atmosphere within the process chamber, including to supply and control the amount and concentration the molecular fluorine source within the process chamber.

According to certain useful or preferred example fluoro-annealing methods, a molecular fluorine source vapor can be a gaseous fluorinated or perfluorinated organic compound such as a fluorinated or perfluorinated alkane or alkene, any of which may be straight or branched. Examples include $CF_4$, $C_2F_4$, $C_3F_6$, $C_4F_8$, $CHF_3$, $C_2H_2F_2$, $C_2F_6$, HF, $CH_3F$, among others, each in a molecular form, meaning substantially non-ionic and not processed (by adding energy other than heat) to degrade or form plasma.

According to other useful or preferred example methods, a molecular fluorine source vapor can be a gaseous fluorinated polymer that has not been processed with energy to form plasma. A gaseous fluorinated polymer can be derived from a non-gaseous (e.g., liquid or solid) fluorinated polymer by heating the non-gaseous fluorinated polymer, for example in a process chamber and in the presence of a deposited yttrium oxide thin film, which is desired to be converted to yttrium fluoride by the fluoro-annealing step.

The fluorinated polymer may be any fluorinated polymer that will be effective according to a method as described for forming yttrium fluoride from a deposited yttrium oxide thin film present on a surface of a substrate. Examples of useful fluorinated polymers include homopolymers and copolymers that include polymerized fluoroolefin monomers and optional non-fluorinated co-monomers. A polymer may be fluorinated (i.e., partially fluorinated), perfluorinated, or may include non-fluorine halogen atoms such as chlorine. A molecular fluorine source may be liquid or solid at room temperature, but will become a vapor at a temperature of a process chamber used according to a method as described.

Non-limiting examples of specific fluoropolymers include: polymerized perfluoroalkylethylene having a $C_1$-$C_{10}$ perfluoroalkyl group; polytetrafluoroethylene (PTFE); tetrafluoroethylene/perfluoro(alkyl vinyl ether) copolymer (PFA); tetrafluoroethylene/hexafluoropropylene copolymer (FEP); tetrafluoroethylene/perfluoro(alkyl vinyl ether)/hexafluoropropylene copolymer (EPA); polyhexafluoropropylene; ethylene/tetrafluoroethylene copolymer (ETFE); poly trifluoroethylene; polyvinylidene fluoride (PVDF); polyvinyl fluoride (PVF); polychlorotrifluoroethylene (PCTFE); ethylene/chlorotrifluoroethylene copolymer (ECTFE); or a combination thereof.

A fluoro-annealing step as described can be performed at any temperature that is effective to cause fluorine from the fluorine source vapor to react with yttrium oxide of a deposited yttrium oxide thin film to convert at least a portion of the deposited yttrium oxide thin film to yttrium fluoride (e.g., at a concentration and depth as described herein). A relatively high elevated temperature is generally useful or preferred, to cause the fluorine source vapor to react with the yttrium oxide to convert the yttrium oxide to a high concentration of yttrium fluoride ($YF_3$) instead of fluorinated yttrium oxide (YOF). Example temperatures of a fluoro-annealing step may be at least 300 or 350 degrees Celsius, or higher, e.g., in a range from 300 to 500 degrees Celsius, such as from 350 or 400 to 425 or 450 degrees Celsius, to produce a high concentration of $YF_3$ at a surface portion of the deposited thin film.

The process chamber can be operated at any useful pressure, with example pressures being approximately atmospheric (760 Torr), e.g., from 100 to 1500 Torr, such as from 250 or 500 to 1000 or 1250 Torr. The atmosphere within the process chamber for converting the yttrium oxide to yttrium fluoride may include a portion that is air, in combination with the molecular fluorine source vapor.

An amount of time used to form yttrium fluoride by a fluoro-annealing step can be based on factors such as temperature of the fluoro-annealing step, the type and amount (concentration) of molecular fluorine source vapor in the process chamber, the thickness and composition of the deposited yttrium oxide thin film, and the desired thickness of the yttrium fluoride portion to be formed from the deposited yttrium oxide thin film. Example amounts of time that are useful or preferred may be in a range of from 1 to 48 hours, e.g., from 2 to 24 hours, or from 3 to 12 hours. A useful period of time for performing a fluoro-annealing step can be a period of time that produces an yttrium fluoride portion (of the deposited thin film) that has a useful or preferred thickness. The thickness will increase over time, during a fluoro-annealing step, with continued exposure of the deposited yttrium oxide thin film to the molecular fluorine source vapor. After a certain amount of time, e.g., after 12, 18, or 24 hours, the thickness of the yttrium fluoride portion of the deposited thin film may no longer substantially increase.

A deposited thin film as described, formed by converting yttrium oxide of a deposited yttrium oxide thin film into yttrium fluoride, will have a composition that includes yttrium, fluorine, oxygen, and possibly a small amount of carbon (e.g., less than 4 or 5 atomic percent carbon), e.g., an yttrium fluoride thin film may contain: yttrium fluoride ($YF_3$), a potential amount of fluorinated yttrium oxide (YOF), and possibly yttrium oxide ($Y_2O_3$). These different materials may be present at different portions of the deposited thin film in a thickness (depth) direction, and in amounts (concentrations) (i.e., non-uniform amounts or concentrations) that vary on a basis of a thickness location of the deposited material, i.e., that vary relative to a depth (thickness) of the yttrium fluoride thin film.

As used herein, the terms "yttrium fluoride thin film" and "yttrium fluoride film" refer to a film or coating that is produced on a substrate by depositing a layer of yttrium oxide material onto the substrate, then converting at least a portion of the deposited yttrium oxide to yttrium fluoride. By these steps, not all of the yttrium oxide of the deposited yttrium oxide film will necessarily be converted to yttrium fluoride. A portion of the film thickness that includes a surface of the film (i.e., a "surface portion") will be converted to a large extent to yttrium fluoride. An intermediate or a lower portion of the film will be converted to yttrium fluoride or to fluorinated yttrium oxide (YOF), and may contain a higher concentration of oxygen compared to locations that are located closer to the surface. Optionally, a lower portion of the film may be converted to yttrium fluoride, may be converted to fluorinated yttrium oxide, or may remain in the form of yttrium oxide.

Because an yttrium fluoride thin film as described is formed by a fluoro-annealing step, the deposited thin film will potentially exhibit a non-uniform, e.g., graded, concentration of one or more of the atomic components that make up the thin film, especially fluorine and oxygen. A concentration of fluorine within the yttrium fluoride thin film may decrease along a thickness direction of the film such that a surface and an outer portion ("upper portion," or "surface portion") of the thin film will contain a higher concentration of fluorine compared to portions that are at greater depths. For example, in some embodiments, the film can have an upper portion that is made substantially of yttrium fluoride, and a lower portion that is fluorinated yttrium oxide, or even non-fluorinated yttrium oxide.

Different portions of a deposited thin film, based on varying composition at different thickness locations of the film, can be identified and described by x-ray photoelectron spectroscopy or "XPS" techniques. These quantitative spectroscopic techniques allow for compositional analysis of a deposited film or layer of material at a surface of the material and below the surface, over a thickness (depth) of the deposited material. The XPS profiling analysis can identify the elemental composition of the deposited material at different locations along the thickness of the material.

Figure 1:
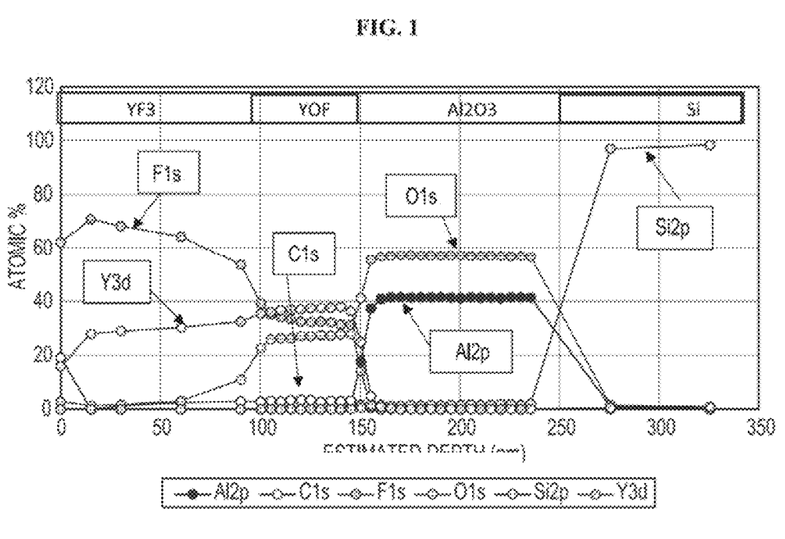
FIG. 1 is a graph showing x-ray diffraction data of coatings of the present description.

FIG. 1 is an XPS profile of a deposited yttrium oxide thin film that has been deposited by atomic layer deposition and subsequently processed to convert yttrium oxide of the deposited yttrium oxide thin film to yttrium fluoride by a fluoro-annealing step, as described. An "upper" portion of the thin film (or a "surface" portion) is considered to be a portion of the thin film that includes a surface of the thin film (at a depth equal to zero) and extends below the surface to a designated thickness (or "depth"). As shown, a surface portion of the tested deposited thin film includes a high amount of yttrium fluoride. The portion of the tested film between the surface (at a depth of zero) to a depth of 50 nanometers, and to 60 nanometers, contains at least 60 atomic percent fluorine and less than 5 percent oxygen, indicating a very high $YF_3$ concentration and a low concentration of YOF. As shown, the yttrium fluoride thin film is formed over an intermediate layer of aluminum oxide ($Al_2O_3$), which has been formed on a surface of a silicon (Si) substrate.

The yttrium fluoride thin film of the measurement of FIG. 1 can be considered to have a "portion" that can be referred to as "yttrium fluoride," e.g., an "yttrium fluoride portion," which includes a surface portion of the thin film. The yttrium fluoride portion is the portion that includes the thin film surface, and that extends to a thickness or depth over which the composition of the thin film material is substantially yttrium fluoride, e.g., is not substantially fluorinated yttrium oxide. As an example, an yttrium fluoride portion may be considered to be a portion of an yttrium fluoride thin film that extends from a surface to a depth at which a concentration of oxygen in the thin film remains below 20 atomic percent oxygen. This thickness may be referred to as "t(20%)." Alternately, an yttrium fluoride portion may be considered to be a portion that extends from a surface to a depth at which a concentration of oxygen in the thin film remains below 10 atomic percent oxygen. This thickness may be referred to as "t(10%)."

Based on a maximum oxygen concentration of 20 atomic percent, example thicknesses t(20%) of yttrium fluoride portions as described can be at least 5 or 10 nanometers, e.g., at least 20 nanometers from a deposited thin film surface, and may have a thickness that is up to or greater than 50, 75, 100, 125, 150, or 200 nanometers. Stated differently an yttrium fluoride portion having an oxygen content below 20 atomic percent at all thickness locations, may extend from a surface to a depth of at least 5, and up to or in excess of 10, 20, 50, 75, 100, 125, 150, or 200 nanometers below the surface.

Based on a maximum oxygen concentration of 10 atomic percent, example thicknesses t(10%) of yttrium fluoride portions as described can be at least 5, 10, or at least 20 nanometers from a deposited thin film surface, and may have a thickness that is up to or greater than 50, 75, or 100 nanometers. Stated differently an yttrium fluoride portion having an oxygen content below 10 atomic percent, at all thickness locations, may extend from a surface to a depth of at least 5, and up to or in excess of 10, 20, 50, 75, or 100 nanometers below the surface.

As shown at FIG. 1, example yttrium fluoride thin films may contain a fluorinated yttrium oxide (YOF) portion, e.g., at a lower portion of the thin film away from the surface and adjacent to the substrate or intermediate layer. Also as shown, this may produce a gradual transition from an intermediate (buffer) metal oxide layer (e.g., of alumina, zirconia, titania, or the like and combinations thereof) to YOF, then to $YF_3$, rather than a transition directly from a metal oxide layer to $YF_3$. If the yttrium fluoride thin film contains a YOF portion, e.g., adjacent to a substrate or an intermediate layer, the thickness of the YOF portion can be controlled based on the thickness of the initial deposited $Y_2O_3$ thin film and conditions (temperature, time of exposure, etc.) of the fluoro-annealing step, which can be controlled.

A film of the invention can also be analyzed by x-ray diffraction to show that the yttrium fluoride portion of the film contains a substantial or high concentration of crystalline $YF_3$, as opposed to other possible stoichiometric combinations of Y, F, and O. X-ray diffraction methods (XRD) are known analytical techniques for assessing atomic and molecular structures of materials, including materials of deposited films. X-ray diffraction, for example, is useful to assess structure and stoichiometry features of a deposited films of the type described herein, e.g., prepared by atomic layer deposition.

Figure 2:
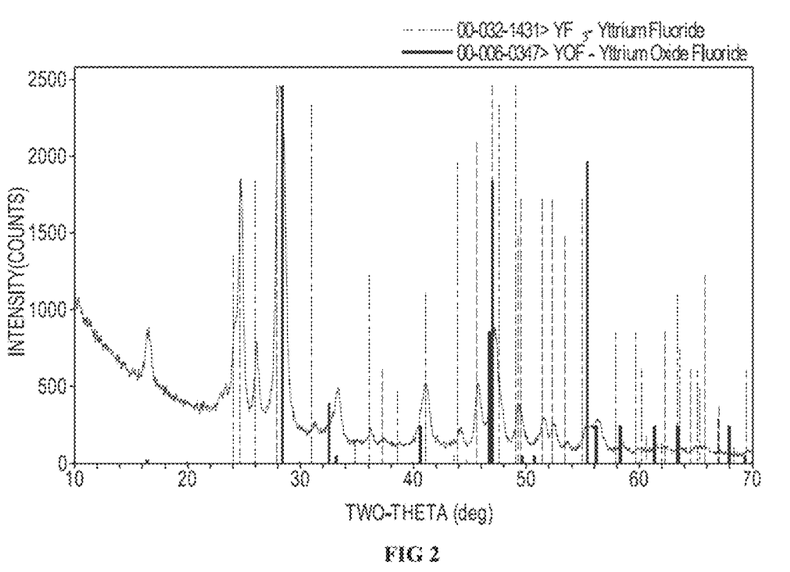
FIG. 2 shows a graph of x-ray diffraction data of an yttrium fluoride film as described.

FIG. 2 shows XRD data of an example yttrium fluoride film of the present description. The data show that the film contains a substantial concentration of (poly-) crystalline $YF_3$, as demonstrated by diffraction peaks that are consistent with the expected $YF_3$ signatures. To the extent that a film will contain an amount of oxygen, the XRD data show that the film will contain a mixture of stoichiometric materials that includes predominantly $YF_3$, in combination with a lower amount of YOF.

According to useful or preferred methods, deposited thin films, and coated substrates, a substrate to which a deposited thin film may be applied can include an intermediate layer that is disposed on the substrate, between the substrate and a deposited thin film as described. As one step of a method as described, an yttrium oxide thin film can be deposited onto a substrate. Subsequently, the yttrium oxide thin film is converted to yttrium fluoride by annealing the yttrium oxide thin film in the presence of fluorine at an elevated temperature, to convert at least a substantial portion of the yttrium oxide to yttrium fluoride. The high temperature used in a fluoro-annealing step has the potential to cause physical damage to the deposited yttrium oxide thin film, such as cracking.

In preferred methods, to prevent physical damage to the yttrium oxide thin film that may be caused by thermal stressing that occurs during the fluoro-annealing step, an intermediate layer (e.g., a "buffer layer") may be placed on the substrate surface between the substrate surface and the yttrium oxide layer. The intermediate layer can be effective to allow the yttrium oxide layer to be processed by the fluoro-annealing step, at high temperature, without causing the yttrium oxide layer to crack due to stresses caused by the high processing temperature of the fluoro-annealing step. The intermediate layer may have physical properties such as a coefficient of thermal expansion that reduces the severity or the effect of thermal stresses that are experienced by the deposited yttrium oxide thin film when the deposited yttrium oxide thin film is processed by the fluoro-annealing step, e.g., at a temperature in excess of 300 degrees Celsius.

An intermediate layer may be any layer that is effective to reduce or prevent undesired physical effects of thermal stresses experienced by the deposited yttrium oxide thin film, preferably to prevent cracking or other physical damage to the deposited yttrium oxide thin film from occurring during a fluoro-annealing step. The composition, thickness, and method of preparing the intermediate layer may be any that are useful to prepare an effective intermediate layer. Examples of intermediate layers may be made of ceramic materials such as metal oxides, e.g., aluminum oxide, titanium oxide, zirconium oxide, and the like. Example thicknesses may be in a range from 25 to 300 nanometers, e.g., from 50 to 200 or 250 nanometers. An example intermediate layer may be applied to a substrate surface by any technique that is effective to allow the intermediate layer to function as described, to prevent physical damage to a deposited yttrium oxide thin film during a fluoro-annealing step. Particular example techniques include chemical vapor deposition, physical vapor deposition, and atomic layer deposition techniques.

Figure 3:
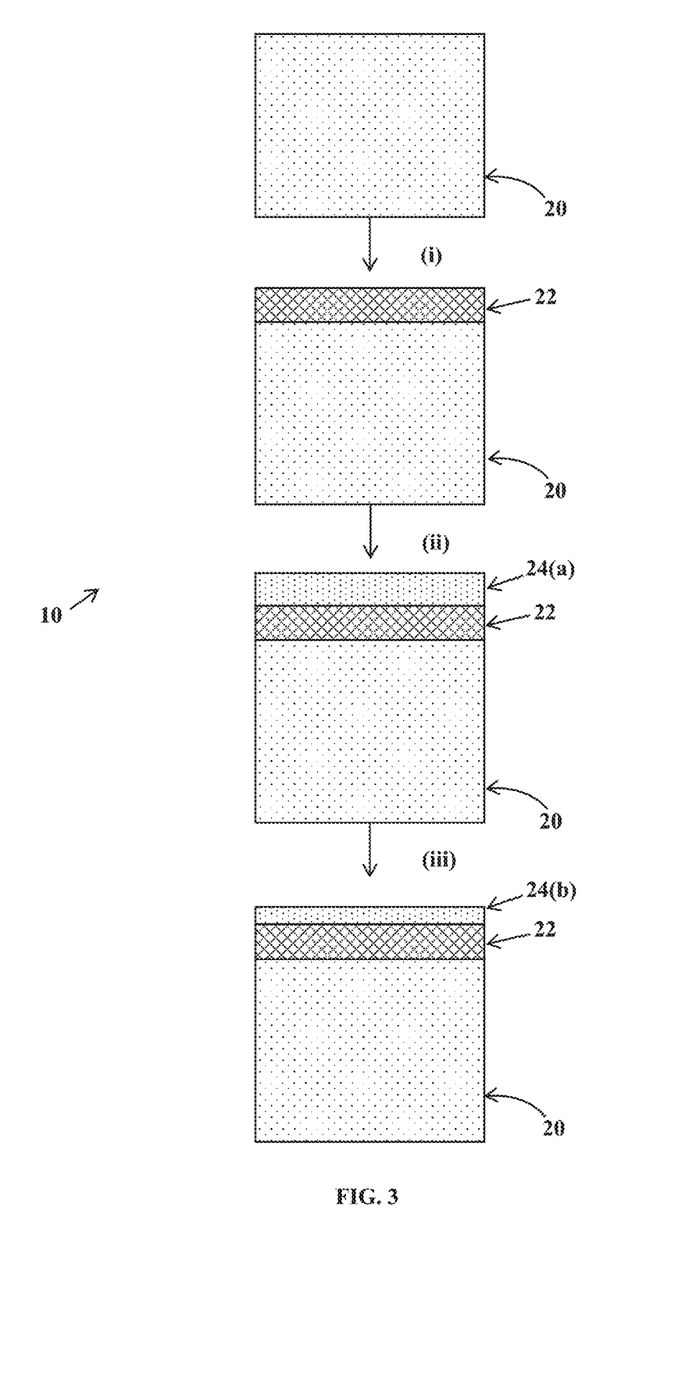
FIG. 3 illustrates an example of a method, and particular method steps, useful for forming an yttrium fluoride thin film as described.

Referring to FIG. 3, illustrated is an example of useful steps of a method as described and example deposited thin films as described. According to method 10, substrate 20 is provided and, in step (i), intermediate layer 22 is applied to a surface of substrate 20. In step (ii), yttrium oxide thin film 24(a) is applied to a surface of intermediate layer 22. In step (iii), substrate 20 with intermediate layer 22 and deposited yttrium oxide thin film 24(a) is subjected to a fluoro-annealing step that converts at least a portion of the yttrium oxide of yttrium oxide thin film 24(a) to yttrium fluoride, producing yttrium fluoride thin film 24(b).

Figure 4:
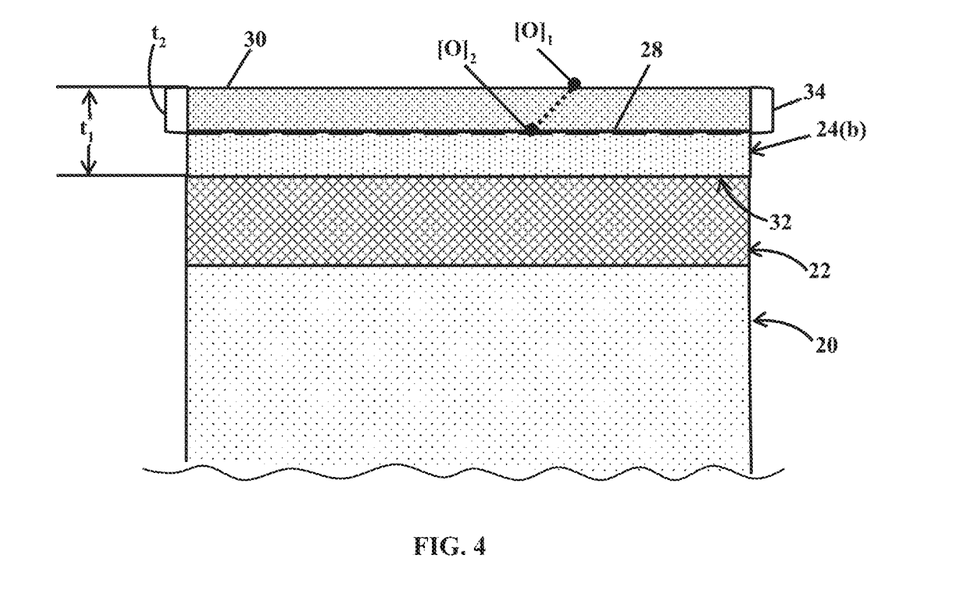
FIG. 4 illustrates an example of a substrate having an yttrium fluoride thin coating at a surface.

FIG. 4 shows substrate 20, intermediate layer 22, and yttrium fluoride thin film 24(b), with added detail relating to the composition of yttrium fluoride thin film 24(b). As shown, yttrium fluoride thin film 24(b) has a thickness (t1) between a lower surface 32 (adjacent an upper surface of intermediate layer 22) and an upper surface 30. Thickness t1 is also a thickness of deposited yttrium oxide thin film 24(a) as deposited onto intermediate layer 22.

Transition 28, represented by the dashed line, indicates a lower boundary of yttrium fluoride portion 34, which extends between surface 30 and transition 28 and has a thickness t2. Yttrium fluoride portion 34 contains a high amount of yttrium fluoride ($YF_3$) and a low amount of oxygen as described herein.

Thickness t2 of yttrium fluoride portion 34 can be defined in a manner as described, for example by defining transition 28 to be located at a depth (thickness) location beneath surface 30 at which a concentration of oxygen in the thin film initially reaches 20 percent (atomic), alternately at a location beneath surface 30 at which a concentration of oxygen in the thin film initially reaches 10 percent. In some embodiments, the thickness of the yttrium fluoride portion may be in a range from 10 nanometers to 200 nanometers, 10 nanometers to 175 nanometers, 10 nanometers to 150 nanometers, 10 nanometers to 125 nanometers, 10 nanometers to 100 nanometers or any ranges therebetween.

The concentration of oxygen ($[O]_2$) in example yttrium fluoride portion 34 of FIG. 3 can be 20 (or 10) atomic percent at the thickness location of transition 28. The concentrations of oxygen at thickness locations above transition 28 are less than 20 (or less than 10) and gradually (regularly or consistently, if not linearly) fall to essentially zero ($[O]_1$) at surface 30. The concentration of oxygen at thickness locations below transition 28, between transition 28 and lower surface 32, are greater than 20 (or greater than 10) atomic percent.

An yttrium fluoride thin film as described, that includes at least a portion that contains a high concentration of yttrium fluoride ($YF_3$) and a low concentration of oxygen, can be effective as a protective coating. The protective coating is chemically resistant to various process materials, especially (but not only) to acids and plasmas that may be present in various types of process chambers during operation to perform manufacturing processes that are known or developed in the future, with certain example processes being described herein.

Yttrium fluoride has a substantially higher concentration of fluorine compared to previous deposited thin films made of yttrium oxide or fluorinated yttrium oxide. Accordingly, the level of chemical resistance achieved by the presently-described yttrium fluoride thin films can be highly useful or relatively improved as compared to levels of chemical resistance achieved by previous protective materials.

Useful and preferred yttrium fluoride thin films can also be temperature resistant over extended periods of time, including during use at high temperatures (e.g., in a range from 350 to 500 degrees Celsius) in a semiconductor processing tool. More generally, a useful or preferred yttrium fluoride thin film can be resistant to degradation for extended periods of time at temperatures of up to or in excess of 200, 300, 400, 450, or 500 degrees Celsius.

Equipment, devices, or articles that include an yttrium fluoride thin film as a protective coating can include a substrate that includes the yttrium fluoride thin film formed on a surface of the substrate, optionally with an intermediate layer disposed between the substrate and the yttrium fluoride thin film. Advantageously, because the yttrium fluoride thin film can be prepared by use of two specific processing steps that each involve gas-phase deposition, i.e., atomic layer deposition of yttrium oxide and fluoro-annealing of the deposited yttrium oxide thin film, the yttrium fluoride thin film that is produced can be effectively and uniformly applied to substrate surfaces that are highly three-dimensional or that have a high aspect ratio. Useful yttrium fluoride thin films can be applied to three-dimensional surfaces that include channels, grooves, or openings such as structures having a relatively high aspect ratio, e.g., an aspect ratio of up to or greater than 10:1, 20:1, 50:1, 100:1, or greater. In some embodiments, a three-dimensional feature on the substrate is selected from: a threaded screw, a threaded nut, a porous membrane, a filter, a three-dimensional network, a hole, and a channel.

Examples of substrates to which a protective yttrium fluoride coating as described can be applied include items such as various components of a process chamber ("process chamber components") used for preparing semiconductor materials, microelectronic devices, and the like. Being resistant to process materials such as acids and plasmas, an yttrium fluoride thin film can be used to protect components of the process chamber in the presence of these and other process materials during operation.

Preferred protective coatings can be prepared to include a low amount of defects such as cracks, fissures, pinholes, and other physical defects. Defects such as pinholes, cracks, and fissures can be identified by visual inspection, optionally with the use of magnification using an optical microscope or a scanning electron microscope, or by other suitable examination methods. Preferred coatings can also be applied to exhibit a high level of coating thickness uniformity across a surface of the coating, especially when compared to coatings applied by other methods, such as by physical vapor deposition. For example, a high level of uniformity can refer to a coating that is less than 2 microns in thickness over an area of 1, 5, or 10 square centimeters, and that does not vary in thickness over that area by more than 20, 10, or 5 percent.

A protective coating as described can be formed on and useful with any surface or substrate upon which an yttrium fluoride thin film may be effectively applied. In particular embodiments, a substrate may be made of a vacuum compatible substrate material and may be in the form of a component of a process chamber that is used to process substrates, materials, or devices by use of one or more different process materials that are highly reactive, corrosive, or otherwise capable of aggressively degrading or reacting with other materials, including internal components of a process chamber. In this context, an yttrium fluoride thin film as described can be advantageously applied to a substrate that is referred to herein as a "vacuum compatible substrate," and that is formed to function as a component of a process chamber (a "process component") used to process microelectronic devices, semiconductor equipment and devices, precursors thereof, etc., by treatment with a process material such as a plasma.

A process chamber is useful to contain highly corrosive or reactive process materials that may be in the form of a liquid, gas, or plasma, used, for example, for processing a microelectronic device substrate or semiconductor device substrate during a step of manufacturing a microelectronic or semiconductor device. Particular examples of reactive process materials include bromine plasma, chlorine plasma, and fluorine plasma, e.g., a plasma derived from $NF_3$, $Cl_2$, $CHF_3$, $CH_2F_2$, SF or HBr.

The process chamber must contain process chamber components and surfaces that are useful to transport, hold, secure, support, or move a workpiece into, out of, and within the process chamber, without being unduly degraded by process materials that will be present in the process chamber. The process chamber must also contain a system of structures that is effective to flow, deliver, and remove the reactive process materials (e.g., plasma) to and from the interior of the process chamber.

Examples of process chamber components include articles of any shape, including flat, planar, essentially two-dimensional surfaces, but also those that have a more complex shape. Advantageously, the present methods and thin films can be used with substrates that have a physical shape or form that is three-dimensional form, such as a form that includes an opening, aperture, channel, tunnel, a threaded screw, a threaded nut, a porous membrane, a filter, a three-dimensional network, a hole, a channel, an extended surface, or the like, including such features that are considered to have a high aspect ratio. More specific example structures include: flow heads (shower heads), shields, trays, supports, nozzles, valves, conduits, stages for handling or holding a substrate, wafer handling fixtures, chamber liners, ceramic wafer carriers, wafer holders, susceptors, spindles, chucks, rings, baffles, and various types of fasteners (screws, nuts, bolts, clamps, rivets, etc.).

Atomic layer deposition techniques and fluoro-annealing techniques as described are gas-phase deposition techniques that are effective to provide a uniform and high quality deposited thin film on such three dimensional surfaces, including surfaces that have an aspect ratio of at least 10:1, 20:1, 50:1, 100:1, or greater.

A substrate of a process component onto which an yttrium fluoride thin film can be formed can be made from a variety of different solid materials, including materials sometimes referred to as "vacuum-compatible" substrate materials. Generally, examples can include ceramic materials, metals, and a metal alloys that can be coated with a protective coating and used in a process chamber. Examples of ceramic materials that can be useful as a vacuum-compatible substrate include alumina, silicon carbide, silicon, silicon oxide, and aluminum nitride. Examples of metals and metal alloys include nickel, nickel alloys, stainless steel, and aluminum. Vacuum-compatible substrates can also be quartz, sapphire, silica, fused silica, fused quartz, silicon, anodized aluminum, zirconium oxide, glass, as well as plastics such as certain plastics used in the semiconductor industry, e.g., as polyether ether ketone (PEEK) and polyimides. In some embodiments, the substrate may be a wall surface of a plasma etch chamber, a wafer susceptor, a chuck, a showerhead, a liner, a ring, a nozzle, a baffle, a fastener, a wafer support, a wafer transport structure, or a portion or component of any one of these.

While the present description refers often to process chambers and process chamber components (e.g., etch chamber components) as useful substrates for a protective coating as described, the described yttrium fluoride thin films are not limited to use with these items. Various other ceramic, mineral, metal, and metal alloy articles and substrates that would benefit from a protective coating having a high level of resistance to highly reactive chemical materials can also be processed to place an yttrium fluoride thin film at a surface thereof, as described herein.

What is claimed:

1. A method of preparing yttrium fluoride, the method comprising:
    depositing an alumina layer onto a substrate to form a surface,
    depositing an yttrium oxide film onto the surface by atomic layer deposition, and
    exposing the yttrium oxide film to molecular fluorine source vapor and an elevated temperature to convert yttrium oxide of the yttrium oxide film to yttrium fluoride, wherein the molecular fluorine source vapor is derived by heating fluorinated polymer, wherein an outer surface of the yttrium oxide film is converted into $YF_3$, wherein the elevated temperature is above 300 degrees Celsius, and wherein the method does not include plasma.

2. The method of claim 1, wherein exposing the yttrium oxide film to fluorine and an elevated temperature forms an yttrium fluoride portion of the yttrium oxide film, the yttrium fluoride portion having a thickness between a surface of the yttrium oxide and a location below the surface of the yttrium oxide at which the film contains 20 atomic percent oxygen.

3. The method of claim 2, wherein the yttrium fluoride portion has a thickness in a range from 10 to 200 nanometers.

4. The method of claim 1, wherein the fluorinated polymer is a homopolymer or copolymer comprising polymerized fluoroolefin monomers.

5. The method of claim 4, wherein the fluorinated polymer comprises: polymerized perfluoroalkylethylene having a $C_1$-$C_{10}$ perfluoroalkyl group; polytetrafluoroethylene (PTFE); a tetrafluoroethylene/perfluoro(alkyl vinyl ether) copolymer (PFA); a tetrafluoroethylene/hexafluoropropylene copolymer (FEP); a tetrafluoroethylene/perfluoro(alkyl vinyl ether)/hexafluoropropylene copolymer (EPA); polyhexafluoropropylene; an ethylene/tetrafluoroethylene copolymer (ETFE); poly trifluoroethylene; polyvinylidene fluoride (PVDF); polyvinyl fluoride (PVF); polychlorotrifluoroethylene (PCTFE); an ethylene/chlorotrifluoroethylene copolymer (ECTFE); or a combination thereof.

6. The method of claim 4, wherein the molecular fluorine source vapor comprises $CF_4$, $C_2F_4$, $C_3F_6$, $C_4F_8$, $CHF_3$, $C_2H_2F_2$, $C_2F_6$, HF, $CH_3F$, or a combination thereof.

* * * * *